United States Patent
Sakiyama et al.

(10) Patent No.: US 7,268,716 B2
(45) Date of Patent: Sep. 11, 2007

(54) MULTIBIT ΔΣ MODULATION DA CONVERTER

(75) Inventors: Ryoji Sakiyama, Kanagawa (JP); Kazuhiro Kimura, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/379,975

(22) Filed: Apr. 24, 2006

(65) Prior Publication Data

US 2006/0255992 A1   Nov. 16, 2006

(30) Foreign Application Priority Data

Apr. 22, 2005   (JP)   ............. 2005-125268

(51) Int. Cl.
*H03M 3/00*   (2006.01)
(52) U.S. Cl. .................... 341/143; 341/155
(58) Field of Classification Search .......... 341/118, 341/155, 150, 143
See application file for complete search history.

(56) References Cited

U.S. PATENT DOCUMENTS

| | | | |
|---|---|---|---|
| 5,990,819 A * | 11/1999 | Fujimori ............ | 341/150 |
| 6,737,999 B2 * | 5/2004 | Schreier ............ | 341/118 |
| 6,741,197 B1 * | 5/2004 | Melanson ........... | 341/150 |
| 6,744,392 B2 * | 6/2004 | Melanson ........... | 341/143 |
| 6,803,869 B1 * | 10/2004 | Melanson et al. ... | 341/143 |
| 6,967,607 B2 * | 11/2005 | Melanson ........... | 341/143 |

FOREIGN PATENT DOCUMENTS

JP   2002-368620   12/2002

* cited by examiner

*Primary Examiner*—Jean Bruner Jeanglaude
(74) *Attorney, Agent, or Firm*—Fish & Richardson P.C.

(57) ABSTRACT

A DA converter comprises a high-pass filter that outputs a multibit digital signal with a predetermined frequency or lower thereof attenuated if a signal level of the input multibit digital signal is less than a predetermined threshold, the high-pass filter outputting the multibit digital signal without attenuation if the signal level is at the threshold or higher; a ΔΣ modulator that performs ΔΣ modulation of the signal output from the filter unit; a dynamic element matching circuit that divides the signal output from the ΔΣ modulator to a plurality of signals; and a plurality of internal DA converters that convert the plurality of signals output from the dynamic element matching circuit to an analog signal.

16 Claims, 11 Drawing Sheets

MULTIBIT ΔΣ MODULATION DA CONVERTER

CROSS-REFERENCE TO RELATED APPLICATIONS

The present application claims priority from Japanese Patent Applications No. 2005-125268 filed on Apr. 22, 2005, which is herein incorporated by reference.

BACKGROUND OF THE INVENTION

1. Field of the Invention

The present invention relates to a multibit ΔΣ modulation DA converter.

2. Description of the Related Art

A multibit ΔΣ modulation DA converter is generally known as a DA converter that converts a multibit digital signal such as a PCM (Pulse Code Modulation) signal to an analog signal. See for example FIG. 13 of Japanese Patent Application Laid-Open Publication No. 2002-368620. Such a DA converter is provided with a plurality of internal DA converters, and signals output from a multibit ΔΣ modulator are sorted by a dynamic element matching circuit (hereinafter, referred to as a DEM circuit) into the internal DA converters.

When performing the multibit ΔΣ modulation in this way, it is known that a noise called idle tone is generated by DC offsets included in the multibit digital signals, due to variations of element levels. Therefore, various methods have been used for preventing the generation of the idle tone.

For example, FIG. 13 shows a conventional example of a configuration of a DA converter that prevents the generation of the idle tone with the use of a zero-point correction circuit. In a DA converter 200 of FIG. 13, the input PCM signal is enhanced in the sampling rate by an interpolation filter 201 and is noise-shaped by a multibit ΔΣ modulator 202. The output signal of the multibit ΔΣ modulator 202 is split by a DEM circuit into a plurality of signals, which is input into a plurality of multibit internal DA converters (hereinafter, referred to as MDACs) 204. An adder 205 adds up the signals output from a plurality of the MDACs 204 to acquire a signal that is an analog signal converted from the input PCM signal.

The DA converter 200 is provided with a zero-point correction circuit 206 that outputs a DC offset opposed to the DC offset included in the PCM signal. Since the DC offset output from the zero-point correction circuit 206 is added to the PCM signal by the adder 207, the DC offset included in the PCM signal is canceled and the generation of the idle tone is constrained.

FIG. 14 shows a conventional example of a configuration of a DA converter that prevents the generation of the idle tone with the use of a dither circuit. A DA converter 210 of FIG. 14 is provided with a dither circuit 211 that outputs a dither signal, instead of the zero-point correction circuit 206 of FIG. 13. In such a configuration, the generation of the idle tone can be constrained by applying a dither signal large enough to mask the DC offset included in the PCM signal.

FIG. 15 shows a conventional example of a configuration of a DA converter that prevents the generation of the idle tone with the use of a high-pass filter. A DA converter 220 of FIG. 15 is provided with a high-pass filter 221, instead of the zero-point correction circuit 206 and the adder 207 of FIG. 13. In such a configuration, the generation of the idle tone can be prevented by removing the DC offset included in the PCM signal with the high-pass filter 221.

However, in the case of the method using the zero-point correction circuit described above, a circuit scale of the zero-point correction circuit is large, which causes cost increase.

In the case of the method using the dither circuit, while a circuit scale can be reduced as compared to the case of using the zero-point correction circuit, if the dither signal is enhanced to be able to mask the DC offset included in the PCM signal, the dither signal itself may generate harmful effects. Therefore, to avoid such harmful effects, complicated circuit design, etc. are needed, which has been technically difficult.

While the method using the high-pass filter has a small circuit scale and is technically easy, it is problematic that a sound quality is deteriorated because the high-pass filter is added to a signal path. The cutoff frequency of the high-pass filter is, for example, on the order of 1 Hz, which is sufficiently low as compared to the audible band, and it is theoretically believed that the audible band is not affected. However, as a result of experiments, more people feel that the volume of low pitch sound is louder and the sound is more real when the high-pass filter is not added.

SUMMARY OF THE INVENTION

The present invention was conceived in view of the above and other problems and it is therefore an object of the present invention to provide a DA converter with a small circuit scale that can easily prevent the effect of the idle tone without causing the deterioration of the sound quality.

In order to achieve the above and other objects, according to an aspect of the present invention there is provided a multibit ΔΣ modulation DA converter comprising a filter unit that outputs a multibit digital signal with a predetermined frequency or lower attenuated if a signal level of the input multibit digital signal is less than a predetermined threshold, the filter unit outputting the multibit digital signal without attenuation if the signal level is at the threshold or higher; a ΔΣ modulator that performs ΔΣ modulation of the signal output from the filter unit; a dynamic element matching circuit that divides the signal output from the ΔΣ modulator to a plurality of signals; and a plurality of internal DA converters that convert the plurality of signals output from the dynamic element matching circuit to an analog signal.

Thus, the present invention can provide a DA converter with a small circuit scale that can easily prevent the effect of the idle tone without causing the deterioration of the sound quality.

Features and objects of the present invention other than the above will become apparent from the description of this specification and the accompanying drawings.

BRIEF DESCRIPTION OF THE DRAWINGS

The above and other objects, aspects, features and advantages of the present invention will become more apparent from the following detailed description when taken in conjunction with the accompanying drawings, in which.

DETAILED DESCRIPTION OF THE INVENTION

At least the following matters will be made clear by the explanation in the present specification and the description of the accompanying drawings.

==Configuration of DA Converter==

Figure 1:
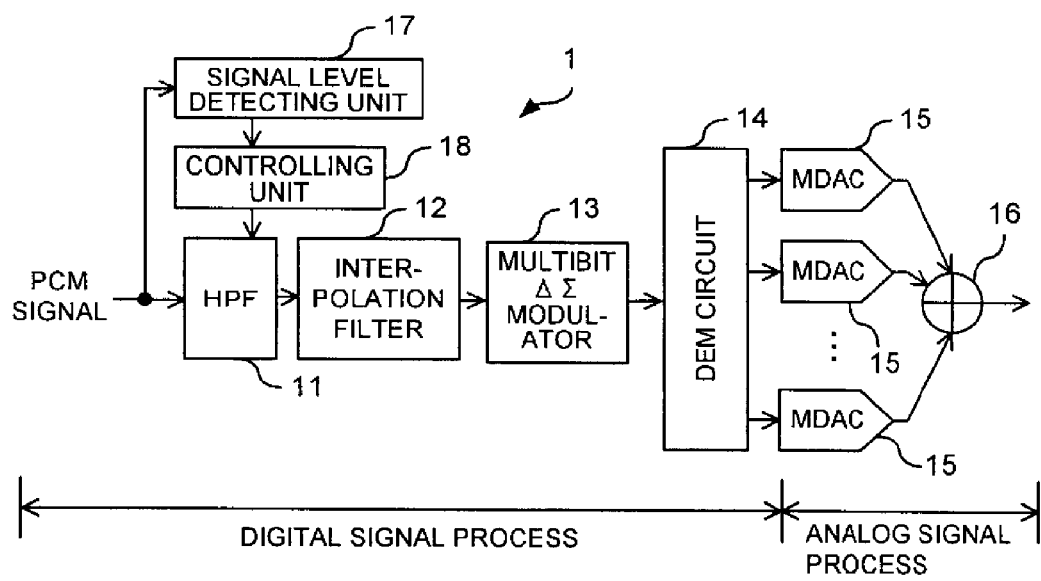
FIG. 1 shows a configuration of a DA converter, which is one embodiment of the present invention.

FIG. 1 shows a configuration of a DA converter 1, which is one embodiment of a multibit ΔΣ modulation DA converter of the present invention. The DA converter 1 is a circuit that converts a multibit digital signal such as a PCM signal to an analog signal for output and is used in, for example, a DSP (Digital Signal Processor), etc. Although the signal input into the DA converter 1 is the PCM signal in this embodiment, the input signal is not limited to the PCM signal as long as the signal is a multibit digital signal.

The DA converter 1 includes a high-pass filter (HPF) 11, an interpolation filter 12, a multibit ΔΣ modulator 13, a DEM circuit 14, a plurality of MDACs 15, an adder 16, a signal level detecting unit 17, and a controlling unit 18. A filter unit of the present invention is constituted by the high-pass filter (HPF) 11, the signal level detecting unit 17, and controlling unit 18.

The high-pass filter 11 has characteristic of attenuating and outputting signals equal to or lower than a predetermined frequency (cutoff frequency) among the input PCM signals. The high-pass filter 11 is for the purpose of removing a DC offset included in the PCM signal and, for example, a cutoff frequency on the order of 1 Hz is set. The high-pass filter 11 may be realized using either hardware or software.

The interpolation filter 12 is a circuit that increases the sampling rate of the signal output from the high-pass filter and outputs the signal. The multibit ΔΣ modulator 13 performs ΔΣ modulation of the signal output from the interpolation filter 12 for noise-shaping.

The DEM circuit 14 is a circuit that prevents deterioration of linearity due to variations in characteristics of the element level of each of a plurality of the MDACs 15 and splits the signal output from the multibit ΔΣ modulator 13 to a plurality of signals, which is output to the MDACs 15. The MDAC 15 converts the signal output from the DEM circuit 14 to an analog signal for output. The adder 16 combines and outputs the analog signal output from each MDAC 15.

The signal level detecting unit 17 detects a signal level of the PCM signal input into the high-pass filter 11 and outputs a result of comparison between the signal level and a predetermined threshold. The controlling unit 18 controls on/off of the high-pass filter 11 or controls changes in the cutoff frequency based on the comparison result output from the signal level detecting unit 17.

Figure 2:
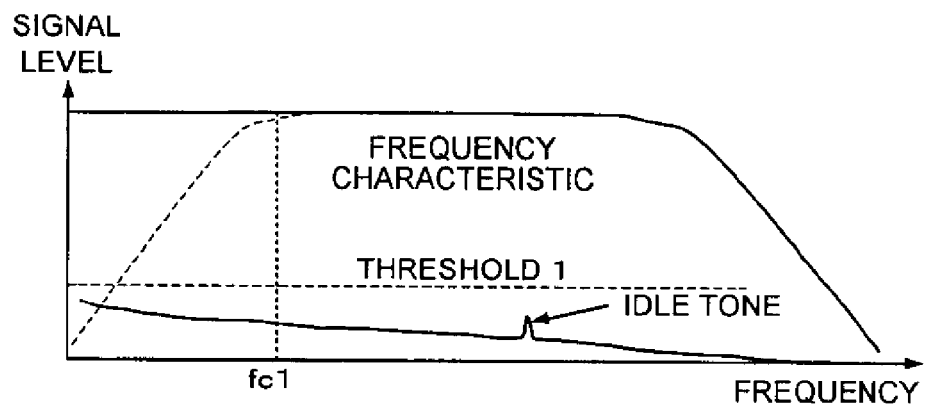
FIG. 2 shows the frequency characteristic of the high-pass filter when the on/off control of the high-pass filter is performed.

Description will be made of an outline of the case that the on/off control of the high-pass filter 11 is performed depending on the signal level of the PCM signal. FIG. 2 shows the frequency characteristic of the high-pass filter 11 when the on/off control of the high-pass filter 11 is performed.

In the case of the on/off control, the signal level detecting unit 17 outputs a result of comparison between the signal level of the PCM signal and a predetermined threshold (threshold 1). The threshold 1 is a value greater than a signal level of the idle tone and it is assumed that the idle tone is difficult to be heard if the signal level of the PCM signal is at the threshold 1 or higher.

If the signal level of the PCM signal is at the threshold 1 or higher, the controlling unit 18 turns off the high-pass filter 11. When the signal level of the PCM signal is at the threshold 1 or higher, a sound volume has been increased to some extent, as in the case of normal music reproduction. In such a case, the idle tone is difficult to be heard and if the idle tone is generated by turning off the high-pass filter 11, no practical problem occurs. Since the high-pass filter 11 is turned off, the PCM signal is not attenuated and the sound quality is not deteriorated.

If the signal level of the PCM signal is lower than the threshold 1, the controlling unit 18 turns on the high-pass filter 11. The cutoff frequency fc1 can be at the level that can remove the DC offset included in the PCM signal, for example, on the order of 1 Hz. In the situation that the signal level of the PCM signal is low enough to hear the idle tone at a faint level in this way, it is difficult to hear minute changes in music, etc. Therefore, if the high-pass filter 11 is turned on to constrain the generation of the idle tone, the effect of the sound quality deterioration does not practically exist.

Figure 3:
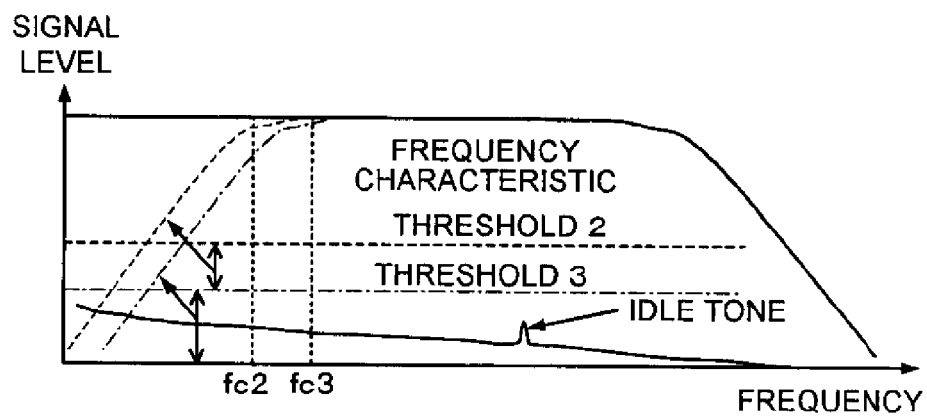
FIG. 3 shows the frequency characteristic of the high-pass filter when the cutoff frequency of the high-pass filter is changed and controlled.

Description will be made of an outline of the case that the cutoff frequency of the high-pass filter 11 is changed depending on the signal level of the PCM signal. FIG. 3 shows the frequency characteristic of the high-pass filter 11 when the cutoff frequency of the high-pass filter 11 is changed and controlled. A threshold 2 (second threshold) and a threshold 3 (first threshold) are used for thresholds compared with the signal level of the PCM signal by the signal level detecting unit 17.

In a general phenomenon, as shown by isosensitive curves called the Fletcher-Munson curve or the loudness curve, it is known that sensitivity to low pitch sound is reduced when the sound volume is low. It is also known that changing points such as phases of a signal tend to be heard exaggeratedly. It is assumed that sensitivity to low pitch sound is extremely reduced if the signal level of the PCM signal is less than the threshold 3. It is also assumed that the idle tone is difficult to be heard if the signal level of the PCM signal is at the threshold 2 or higher.

If the signal level of the PCM signal is at the threshold 2 or higher based on the comparison result output from the signal level detecting unit 17, the controlling unit 18 turns off the high-pass filter 11. If the signal level of the PCM signal is less than the threshold 2 as well as the threshold 3 or higher, the high-pass filter 11 is turned on. A cutoff frequency fc2 (first frequency) in this case is on the order of 1 Hz, for example. In this way, the same effect as the above description can be acquired by switching on/off of the high-pass filter 11 above and below the threshold 2.

If the signal level of the PCM signal is less than the threshold 3, the controlling unit 18 changes the cutoff frequency of the high-pass filter 11 to fc3 (a second frequency). The cutoff frequency fc3 is a frequency higher than the cutoff frequency fc2 and can be on the order of 20 Hz, for example. In this way, in the situation when sensitivity to low pitch sound is reduced, low pitch sound can be heard exaggeratedly by increasing the cutoff frequency to provide the changing points in the low pitch sound range of the audible band.

==Signal Level Detecting Unit==

Figure 4:
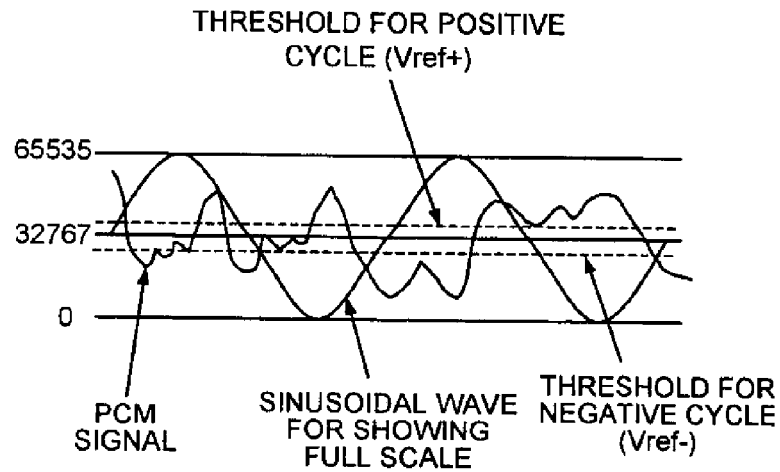
FIG. 4 shows a relationship between the PCM signal and thresholds.

Description will be made of details of the signal level detecting unit 17. FIG. 4 shows a relationship between the PCM signal and thresholds. In this embodiment, the number of bits of the PCM signal is 16 bits, for example; a peak value of the positive cycle is 65535; a peak value of the negative cycle is 0; and an intermediate value is 32767. The signal level of the present invention is an absolute value of a difference between the value of the PCM signal and the intermediate value.

FIG. 4 shows Vref+ that is a threshold for the positive cycle and Vref− that is a threshold for the negative cycle. The threshold of the present invention is an absolute value of a difference between Vref+/Vref− and the intermediate value of 32767. That is, if the value of the PCM signal is located between Vref+ and Vref−, the signal level is less than the threshold. Therefore, if the on/off control of the high-pass filter 11 is performed, Vref+ and Vref− are values increased and decreased from the intermediate value of 32767 by the threshold 1 described above.

If the cutoff frequency is changed and controlled in addition to the on/off control, Vref+ and Vref− corresponding to the threshold 2 and the threshold 3 must be also defined.

Figure 5:
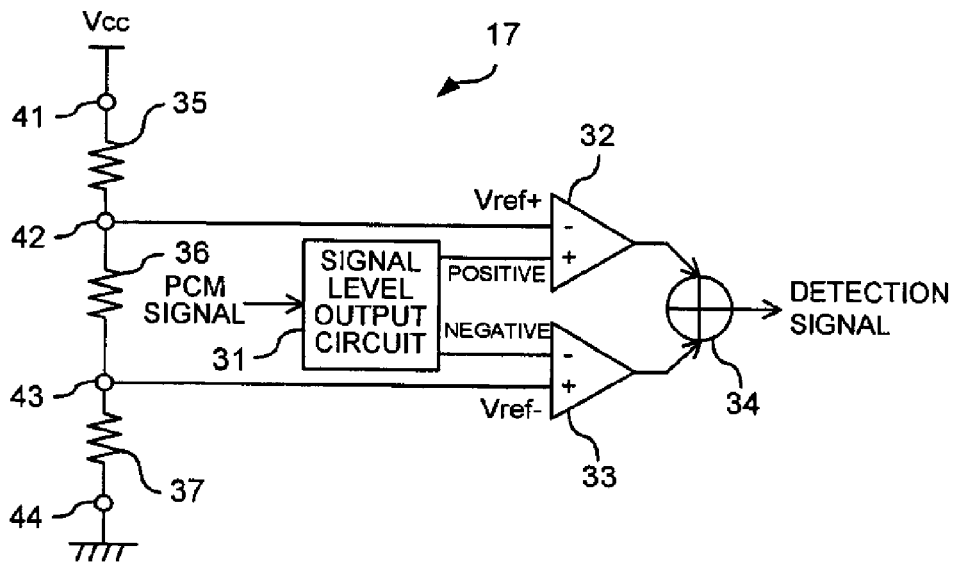
FIG. 5 shows an example when the signal level detecting unit is constituted by hardware.

FIG. 5 shows an example when the signal level detecting unit 17 is constituted by hardware. The signal level detecting unit 17 is constituted by including a signal level output circuit 31, comparators (comparison circuits) 32, 33, an adder 34, and resistances 35 to 37. The resistances 35 to 37 are for the purpose of generating Vref+ and Vref− from an internal voltage Vcc. The resistances 35 to 37 may be connected to the outside of the signal level detecting unit 17 via terminals 41 to 44.

The signal level output circuit 31 is a circuit that outputs a value of the positive cycle and a value of the negative cycle of the PCM signal. Methods of detecting the value of the positive cycle and the value of the negative cycle include, for example, a method of obtaining an average value for a certain period with the use of an integrating circuit and a method of obtaining a peak value for a certain period with the use of a peak hold circuit.

The comparator 32 is a circuit that outputs a result of comparison between the value of the positive cycle output from the signal level output circuit 31 and Vref+. In the comparator 32, the value of the positive cycle is input to a noninverted input terminal and Vref+ is input to an inverted input terminal. Therefore, the output of the comparator 32 is H if the value of the positive cycle is Vref+ or higher and is L if the value of the positive cycle is less than Vref+.

The comparator 33 is a circuit that outputs a result of comparison between the value of the negative cycle output from the signal level output circuit 31 and Vref−. In the comparator 33, the value of the negative cycle is input to an inverted input terminal and Vref− is input to a noninverted input terminal. Therefore, the output of the comparator 33 is H if the value of the negative cycle is Vref− or lower and is L if the value of the negative cycle is greater than Vref−.

Figure 6:
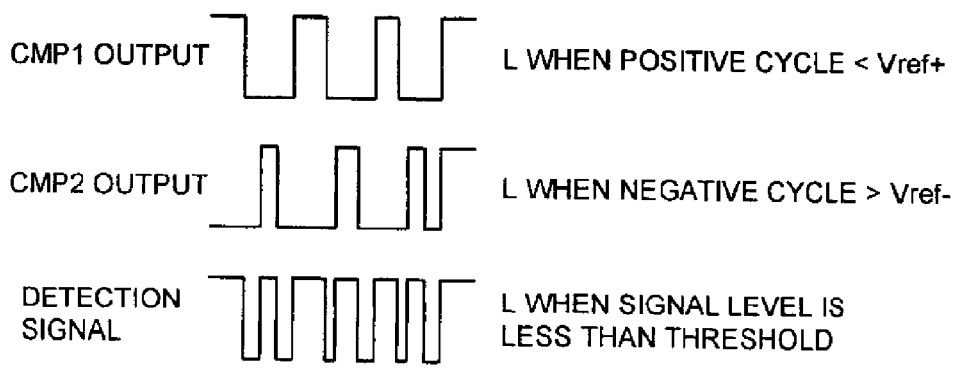
FIG. 6 shows examples of the output signals from the comparators and the detection signal output from the adder.

The signals output from the comparators 32, 33 are added by the adder 34 and are output to be a detection signal. FIG. 6 shows examples of the output signals from the comparators 32, 33 and the detection signal output from the adder 34. As described above, the output signal CMP1 from the comparator 32 is L if the value of the positive cycle is less than Vref+ and the output signal CMP2 from the comparator 33 is L if the value of the negative cycle is greater than Vref−. Therefore, the detection signal output from the adder 34 is L if the value of the positive cycle is less than Vref+ and the value of the negative cycle is greater than Vref−. That is, the detection signal is L if the signal level of the PCM signal is less than a predetermined threshold. Therefore, if the on/off control of the high-pass filter 11 is performed, the high-pass filter may be turned on if the detection signal is L and the high-pass filter may be turned off if the detection signal is H.

Similarly, if the cutoff frequency is changed and controlled in addition to the on/off control of the high-pass filter 11, two sets of Vref+ and Vref− can be generated and the signal level of the PCM signal can be compared with the threshold with the use of four comparators.

The result of the comparison between the signal level of the PCM signal and the predetermined threshold can be output without using the comparators. For example, if the PCM signal is constituted by 16 bits as described above, the result of the comparison between the signal level of the PCM signal and the predetermined threshold can be output based on a value of each bit. For example, a comparison result can be output to indicate that the signal level is a predetermined threshold or higher if any one of the most significant bit to fifth bit is 1. When the comparison result is output based on a value of each bit of the PCM signal in this way, the result of the comparison between the signal level and the threshold can also be output for both the value of the positive cycle and the value of the negative cycle of the PCM signal.

Although the result of the comparison between the signal level and the threshold is output with the use of the value of the positive cycle and the value of the negative cycle of the PCM signal in this embodiment, only one value may be used. An effective value of the PCM signal may be obtained with the use of an integrating circuit, etc. and the effective value may be compared with the threshold. The comparators 32, 33 may be digital comparators, which compare digital values of the positive cycle and the negative cycle of the PCM signal with digital values corresponding to Vref+ and Vref−.

==High-Pass Filter and Controlling Unit==

Figure 7:
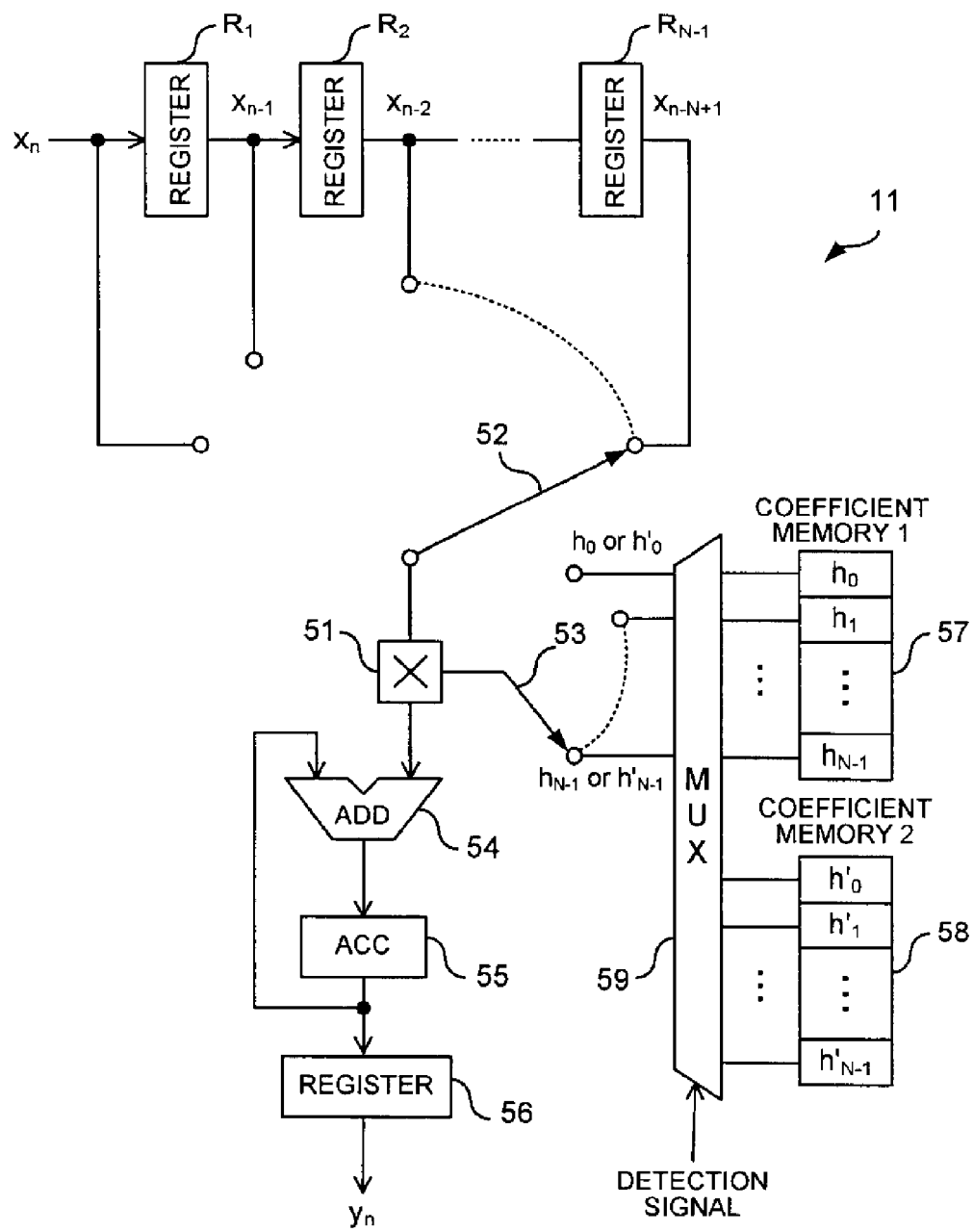
FIG. 7 shows an example of a configuration of the FIR filter using a multiplier.

Description will be made of details of the high-pass filter 11 and the controlling unit 18. FIG. 7 is an example when a digital filter, i.e., a FIR (Finite Impulse Response) filter is constituted by using a multiplier. As shown in FIG. 7, the high-pass filter 11 includes registers $R_1$ to $R_{N-1}$, that store an input data series, a multiplier 51, switches 52, 53, an adder-subtracter 54, an accumulator 55, a register 56 that stores output data, and coefficient memories (storing units) 57, 58 that store coefficients (frequency characteristic data) for determining the cutoff frequency. A multiplexer (MUX) 59 is provided as the controlling unit 18. An attenuation processing unit of the present invention corresponds to the registers $R_1$ to $R_{N-1}$, the multiplier 51, the switches 52, 53, the adder-subtracter 54, the accumulator 55, and the register 56.

Data $x_n$ input to the register $R_1$ are the PCM signal input to the high-pass filter 11. The register $R_i$ (i=1 to N−1) stores data $x_{n-i}$, which are data preceding the data $x_n$ by i. The coefficient memory 57 stores coefficients $h_0$ to $h_{N-1}$ (first frequency characteristic data) and the coefficient memory 58 stores coefficients $h'_0$ to $h'_{N-1}$ (second frequency characteristic data).

The multiplexer 59 selects and outputs the coefficients stored in either the coefficient memory 57 or the coefficient memory 58 based on the detection signal output from the signal level detecting unit 17.

In the FIR filter, if the coefficients are $h_0$ to $h_{N-1}$ and when the data $x_n$ is input, an output $y_n$ is expressed by the following equation (1).

$$y_n = \sum_{k=0}^{N-1} h_k x_{n-k} \qquad (1)$$

Description will be made of operation when the data $x_n$ is input to the high-pass filter 11 shown in FIG. 7. It is assumed that the multiplexer 59 selects and output the coefficients $h_0$ to $h_{N-1}$. When the data $x_n$ is input, the switch 52 is sequentially switched to input $x_{n-N+1}$ to $x_n$ to one input terminal of the multiplier 51 sequentially. In synchronization with the switching of the switch 52, the switch 53 is sequentially switched to input the coefficients $h_{N-1}$ to $h_0$ to the other input terminal of the multiplier 51 sequentially. Values output from the multiplier 51 are cumulatively added by the adder-subtracter 54 and the accumulator 55. Therefore, when the switches 52, 53 are switched for N times, a value $y_n$ output from the accumulator 55 is the value shown in equation (1). The value $y_n$ is latched and output by the register 56 as the output of the FIR filter.

When the multiplexer 59 selects and outputs the coefficients $h'_0$ to $h'_{N-1}$, $y_n$ is a value shown in the following equation (2).

$$y_n = \sum_{k=0}^{N-1} h'_k x_{n-k} \qquad (2)$$

That is, the frequency characteristic of the high-pass filter 11 can be changed by switching the coefficients. Therefore, for example, the on/off of the high-pass filter 11 can be switched by setting $h_0$ to $h_{N-1}$ as coefficients that achieve the cutoff frequency of 1 Hz and by setting $h'_0$ to $h'_{N-1}$ as coefficients that do not attenuate the signal in the high-pass filter 11. For example, in the case of $h'_0=1$ and $h'_1$ to $h'_{N-1}=0$, since $y_n=x_n$ from equation (2), the signal is not attenuated.

Similarly, the cutoff frequency can be switched to 1 Hz or 20 Hz depending on the signal level of the PCM signal by setting $h_0$ to $h_{N-1}$ as coefficients that achieve the cutoff frequency of 1 Hz and by setting $h'_0$ to $h'_{N-1}$ as coefficients that achieve the cutoff frequency of 20 Hz.

If the on/off or the change in the cutoff frequency of the high-pass filter 11 is controlled by switching the coefficients, noise may be generated by changing the frequency characteristic abruptly. Therefore, the cutoff frequency may be changed to be increased or decreased gradually. For example, if the high-pass filter 11 is turned off from the state of the cutoff frequency of 1 Hz, after the cutoff frequency is gradually decreased from 1 Hz to 0.3 Hz, 0.1 Hz, 0.03 Hz, and 0.01 Hz, the high-pass filter 11 is turned off. Such control can be achieved by providing a coefficient memory that stores coefficients corresponding to these intermediate cutoff frequencies (third frequency characteristic data) and by switching the coefficients step-by-step with the use of the multiplexer 59.

A circuit may be provided for detecting the zero cross of the PCM signal to switch the coefficients when the zero cross is detected. In this way, the generation of the noise can be constrained at the time of the switching by switching the coefficients in the vicinity of the zero cross of the PCM signal.

For the control of turning off the high-pass filter 11, the input data $X_n$ can be directly output with the use of a switching circuit, instead of changing the coefficients.

Figure 8:
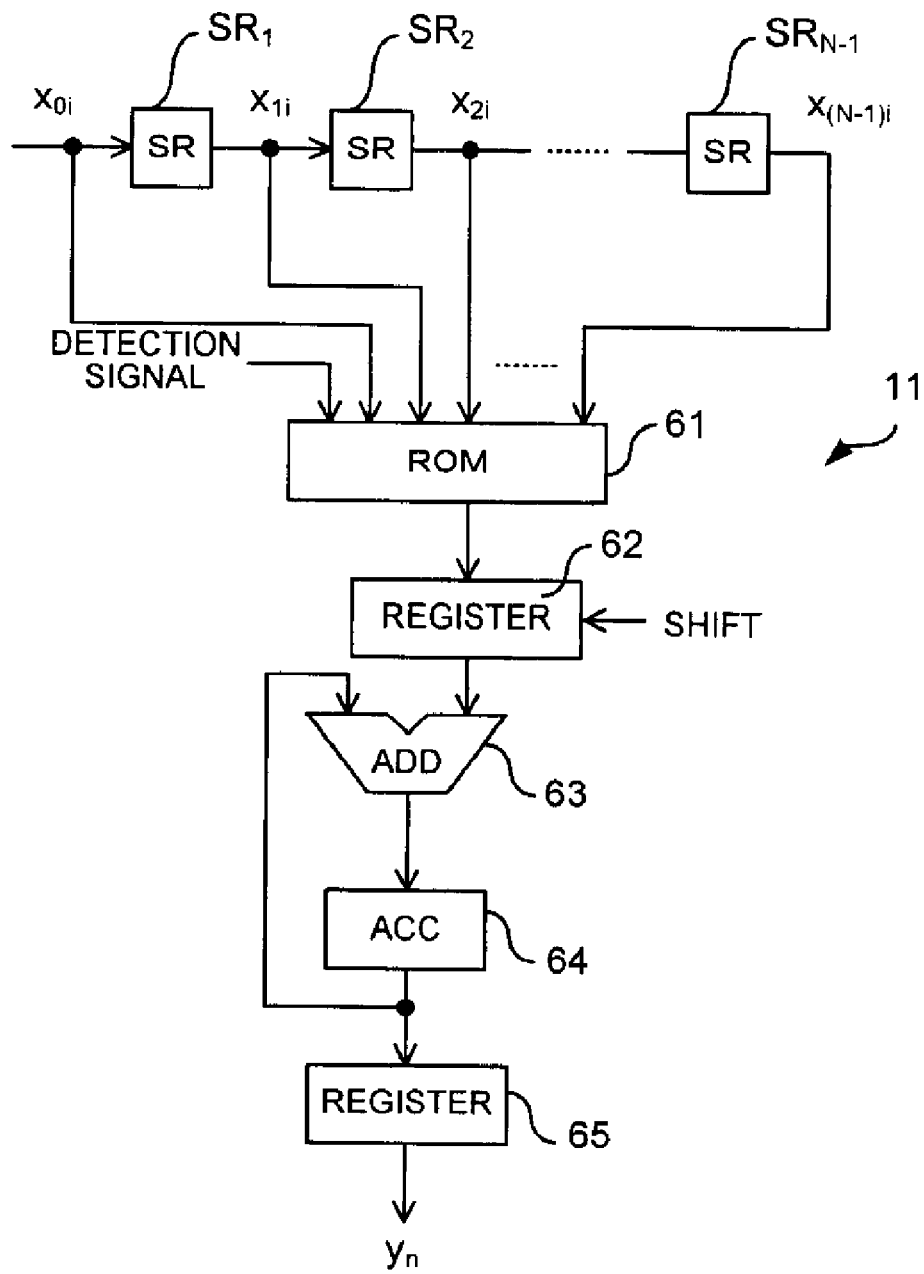
FIG. 8 shows an example of a configuration of the FIR filter using a ROM.

FIG. 8 shows an example when the FIR filter is constituted by using a ROM (Read Only Memory). As shown in FIG. 8, the high-pass filter 11 includes shift registers $SR_1$ to $SR_{N-1}$ that store an input data series, a ROM 61, a register 62, an adder-subtracter 63, an accumulator 64, and a register 65 that stores output data. The attenuation processing unit of the present invention corresponds to the shift registers $SR_1$ to $SR_{N-1}$, the registers 62, 65, the adder-subtracter 63, and the accumulator 64, and the storing unit and the controlling unit of the present invention correspond to the ROM 61.

It is assumed that the data $X_n$ are the L-bit binary number $(X_{n0}, X_{n1}, \ldots, X_{n(L-1)})$ represented by a two's complement and that an absolute value is less than one. In this case, $X_n$ can be expressed by the following equation (3).

$$x_n = -x_{n0} + \sum_{i=0}^{L-1} x_{ni} 2^{-i} \qquad (3)$$

While the output $y_n$ of the FIR filter is as shown in equation (1) when the coefficients are $h_0$ to $h_{N-1}$, the output $y_n$ can be expressed as the following equation (4) by reversing the order of $X_n$.

$$y_n = \sum_{k=0}^{N-1} h_k x_n \qquad (4)$$

The following equation (5) can be obtained by substituting equation (4) for equation (3).

$$y_n = \sum_{k=0}^{N-1} h_n \left[ \sum_{i=1}^{L-1} x_{ni} 2^{-i} - x_{n0} \right] \qquad (5)$$

The following equations (6) and (7) can be obtained by interchanging the order of the sums of the inside and the outside of equation (5).

$$y_n = \sum_{i=1}^{L-1} 2^{-i} S_{ni} - S_{n0} \qquad (6)$$

$$S_{ni} = \sum_{n=0}^{N-1} x_{ni} h_n \qquad (7)$$

Since $x_{ni}$ is 1 or 0, $S_{ni}$ is a sum of $h_n$ when $x_{ni}$ is not 0. That is, $S_{ni}$ is determined by the pattern of N-bit $x_{ni}$ (n=0 to N−1). Therefore, $S_{ni}$ (frequency characteristic data) corresponding to each pattern is stored in the ROM 61. The ROM 61 also stores $S_{ni}$ for the case of using coefficients other than $h_0$ to $h_{N-1}$ (e.g., $h'_0$ to $h'_{N-1}$). When $S_{ni}$ is stored in the ROM 61, for example, the address is the $x_{ni}$ pattern added with the detection signal output from the signal level detecting unit 17.

In FIG. 8, the bit length of the shift registers $SR_1$ to $SR_{N-1}$ is L bits; the shift registers $SR_1$ stores the latest data; and the shift registers $SR_{N-1}$ stores the earliest data. Every time a clock is input, the contents of the shift registers $SR_1$ to $SR_{N-1}$ are transferred to the right by one bit. When it is assumed that the data output from each shift register $SR_1$ to $SR_{N-1}$ are ith bit data $x_{ni}$ (n=0 to N−1), $S_{ni}$ corresponding to the $x_{ni}$ pattern and the detection signal is read from the ROM 61 by specifying the address, which is the pattern added with the detection signal. The register 62 shifts $S_{ni}$ read from the ROM 61 to the right by i bit to obtain and output $2^{-i}S_{ni}$. $y_n$ shown in equation (6) can be obtained by adding $S_{ni}$ output in this way with the use of the adder-subtracter 63 and the accumulator 64 and by subtracting $S_{n0}$.

By changing the value output from the ROM 61 based on the detection signal, the on/off control and the change in the cutoff frequency of the high-pass filter 11 can be performed as is the case for using the multiplier.

Figure 9:
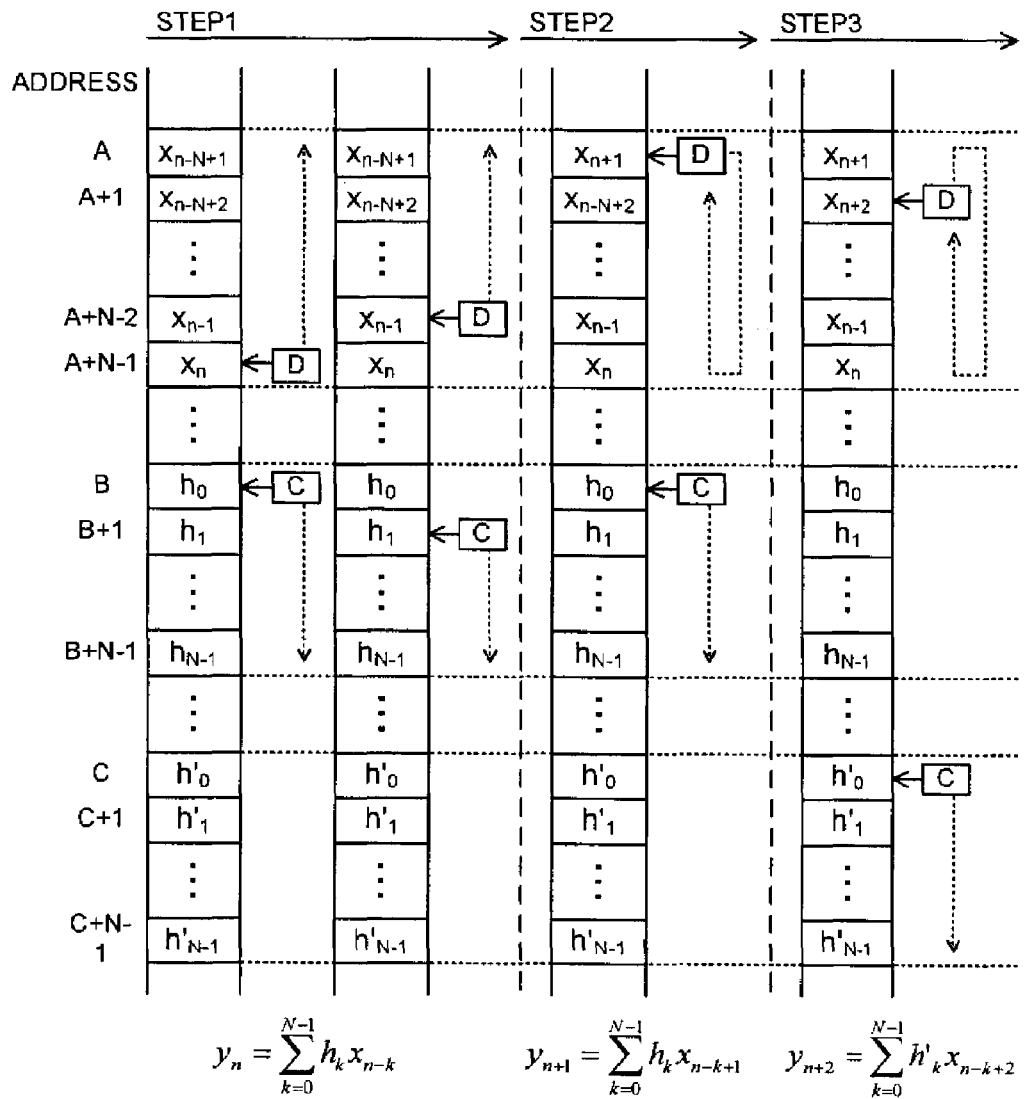
FIG. 9 shows an outline of the data process when the FIR filter is realized with software.

The high-pass filter 11 and the controlling unit 18 are not limited to those using hardware and can be realized with software. FIG. 9 shows an outline of the data process when the FIR filter is realized with software. In this example, the input data are stored at address A to address A+N−1; the coefficients $h_0$ to $h_{N-1}$ are stored at address B to address B+N−1; and the coefficients $h'_0$ to $h'_{N-1}$ are stored at address C to address C+N−1. A pointer D is a pointer for specifying the data and a pointer C is a pointer for specifying the coefficients.

STEP 1 is a step for obtaining the output $y_n$ when the data $x_n$ are output. In the initial state, the value of the pointer D is A+N−1 and the value of the pointer C is B. While decrementing the pointer D by one and incrementing the pointer C by one, the high-pass filter 11 calculates $h_k x_{n-k}$ (k=0 to N−1), which are added to obtain $y_n$.

STEP 2 is a step for obtaining the output $y_{n+1}$ when the data $x_{n+1}$ are output. In the state immediately after obtaining $Y_n$, the value of the pointer D is A where the earliest data $x_{n-N+1}$ are stored. Therefore, at the address A where the earliest data $x_{n-N+1}$ are stored, the high-pass filter 11 stores the next data $x_{n+1}$ and while decrementing the pointer D by one and incrementing the pointer C by one, the high-pass filter 11 calculates $h_k x_{n-k+1}$ (k=0 to N−1), which are added to obtain $y_{n+1}$. When decrementing the pointer D, the high-pass filter 11 is transited from the address A to the address A+N−1, and when incrementing the pointer C, the high-pass filter 11 is transited from the address B+N−1 to the address B.

STEP 3 is a step for obtaining the output $y_{n+2}$ when the data $x_{n+2}$ are output. The controlling unit 18 changes the value of the pointer C to the address C based on the detection signal from the signal level detecting unit 17. At the address A+1 where the data $x_{n-N+2}$ are stored, the high-pass filter 11 stores the next data $x_{n+2}$ and while decrementing the pointer D by one and incrementing the pointer C by one, the high-pass filter 11 calculates $h'_k x_{n-k+2}$ (k=0 to N−1), which are added to obtain $y_{n+2}$.

In this way, when the high-pass filter 11 and the controlling unit 18 are realized with software, the cutoff frequency of the high-pass filter 11 can be changed based on the signal level of the PCM signal. If the high-pass filter 11 is turned off, the input data may be directly output. If the high-pass filter 11 is turned off, or if the cutoff frequency is changed, the generation of the noise can be constrained at the time of the switching by changing the coefficients stepwise similarly to the case of the hardware described above.

Figure 10:
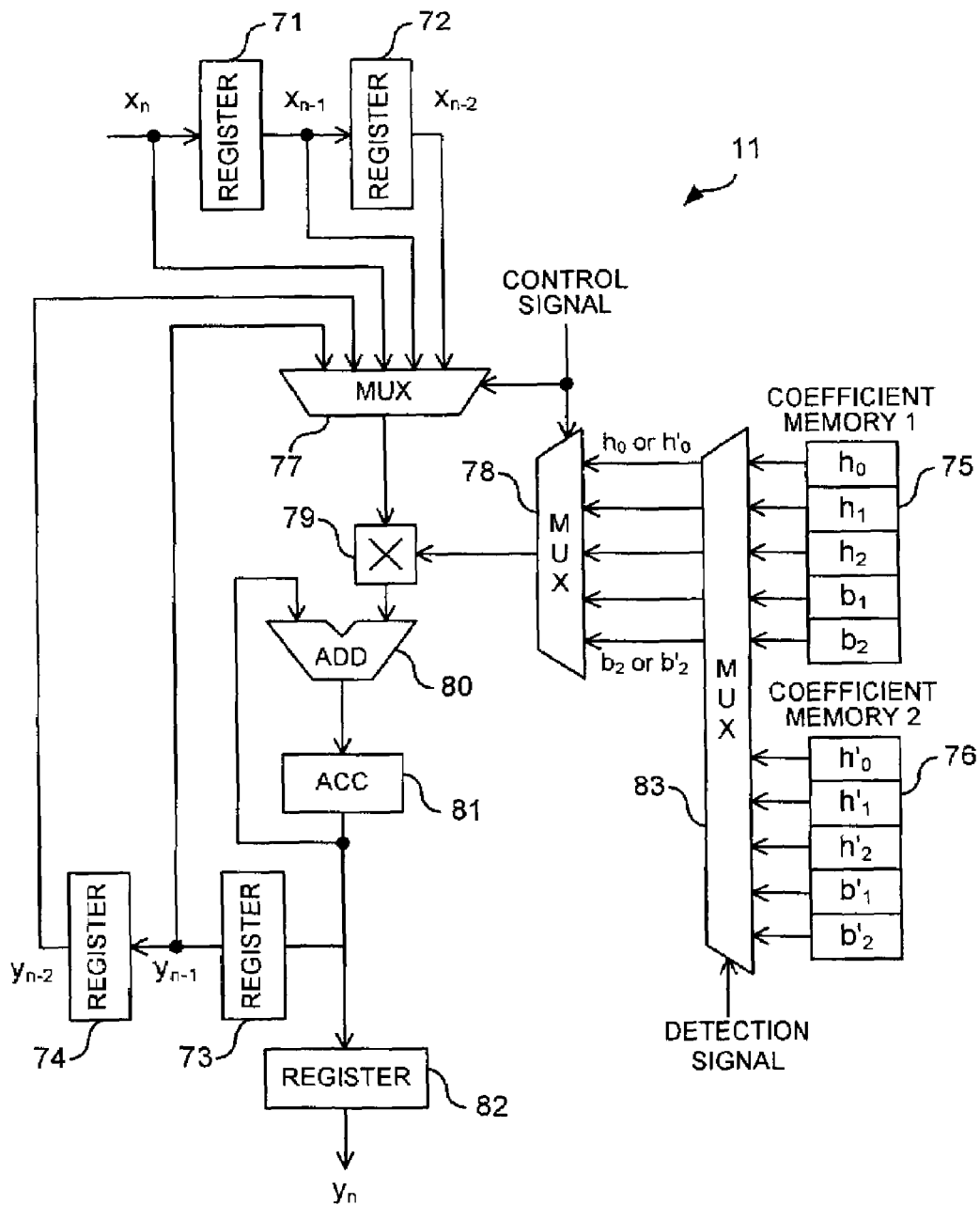
FIG. 10 shows an example of a configuration of the secondary IIR filter using a multiplier.

The digital filter is not limited to the FIR filter and can be an IIR (Infinite Impulse Response) filter. FIG. 10 shows a configuration of a secondary IIR filter using a multiplier. The high-pass filter 11 includes registers 71, 72 that store an input data series, registers 73, 74 that store an output data series, coefficient memories (storing units) 75, 76, multiplexers 77, 78, a multiplier 79, an adder-subtracter 80, an accumulator 81, and a register 82 that stores output data. A multiplexer 83 is provided as the controlling unit 18. The attenuation processing unit of the present invention corresponds to the registers 71 to 74, the multiplexers 77, 78, the multiplier 79, the adder-subtracter 80, the accumulator 81, and the register 82.

In such a configuration, the register 71 stores data $x_{n-1}$ immediately before the input data $x_n$, and the register 72 stores the data $x_{n-2}$ two stages before $x_n$. The register 73 stores the last output data $y_{n-1}$, and the register 74 stores the second last output data $y_{n-2}$. The coefficient memory 75 stores coefficients $h_0$, $h_1$, $h_2$, $b_1$, and $b_2$, and the coefficient memory 76 stores coefficients $h'_0$, $h'_1$, $h'_2$, $b'_1$, and $b'_2$.

The multiplexer 83 selects and outputs the coefficients stored in either the coefficient memory 75 or the coefficient memory 76 based on the detection signal output from the signal level detecting unit 17.

In the secondary IIR filter, if the coefficients are $h_0$, $h_1$, $h_2$, $b_1$, and $b_2$, when the data $x_n$ is input, an output $y_n$ is expressed by the following equation (8).

$$y_n = h_0 x_n + h_1 x_{n-1} + h_2 x_{n-2} - b_1 y_{n-1} - b_2 y_{n-2} \qquad (8)$$

Description will be made of operation when the data $x_n$ is input to the high-pass filter 11 shown in FIG. 10. It is assumed that the multiplexer 83 selects and outputs the coefficients $h_0$, $h_1$, $h_2$, $b_1$, and $b_2$.

To the multiplexer 77, $x_n$, $x_{n-1}$, $x_{n-2}$, $y_{n-1}$, and $y_{n-2}$ are input. To the multiplexer 78, $h_0$, $h_1$, $h_2$, $b_1$, and $b_2$ are input, which are output from the multiplexer 83. In accordance with the input control signal, the multiplexer 77 selects and inputs the data in the order of $x_n$, $x_{n-1}$, $x_{n-2}$, $y_{n-1}$, and $y_{n-2}$ to one input terminal of the multiplier 79. In synchronization with the multiplexer 77 and in accordance with the input control signal, the multiplexer 77 selects and inputs the data in the order of $h_0$, $h_1$, $h_2$, $b_1$, and $b_2$ to the other input terminal of the multiplier 79. Therefore, the multiplier 79 outputs $h_0 x_n$, $h_1 x_{n-1}$, $h_2 x_{n-2}$, $b_1 y_{n-1}$, and $b_2 y_{n-2}$ sequentially. By adding and subtracting these values output from the multiplier 79 with the adder-subtracter 80 and accumulator 81, a value $y_n$ output from the accumulator 81 will be a value shown in equation (8). $y_n$ are latched and output by the register 82 as the output of the IIR filter.

When the multiplexer 83 selects and outputs the coefficients $h'_0$, $h'_1$, $h'_2$, $b'_1$, and $b'_2$, $y_n$ is a value shown in the following equation (9).

$$y_n = h'_0 x_n + h'_1 x_{n-1} + h'_2 x_{n-2} - b'_1 y_{n-1} - b'_2 y_{n-2} \qquad (9)$$

In this way, in the case of the IIR filter, the on/off control and the change in the cutoff frequency can be performed by switching the coefficients based on the detection signal as is the case with the FIR filter. The generation of the noise can be constrained at the time of the switching by changing the coefficients stepwise as is the case with the FIR filter.

Figure 11:
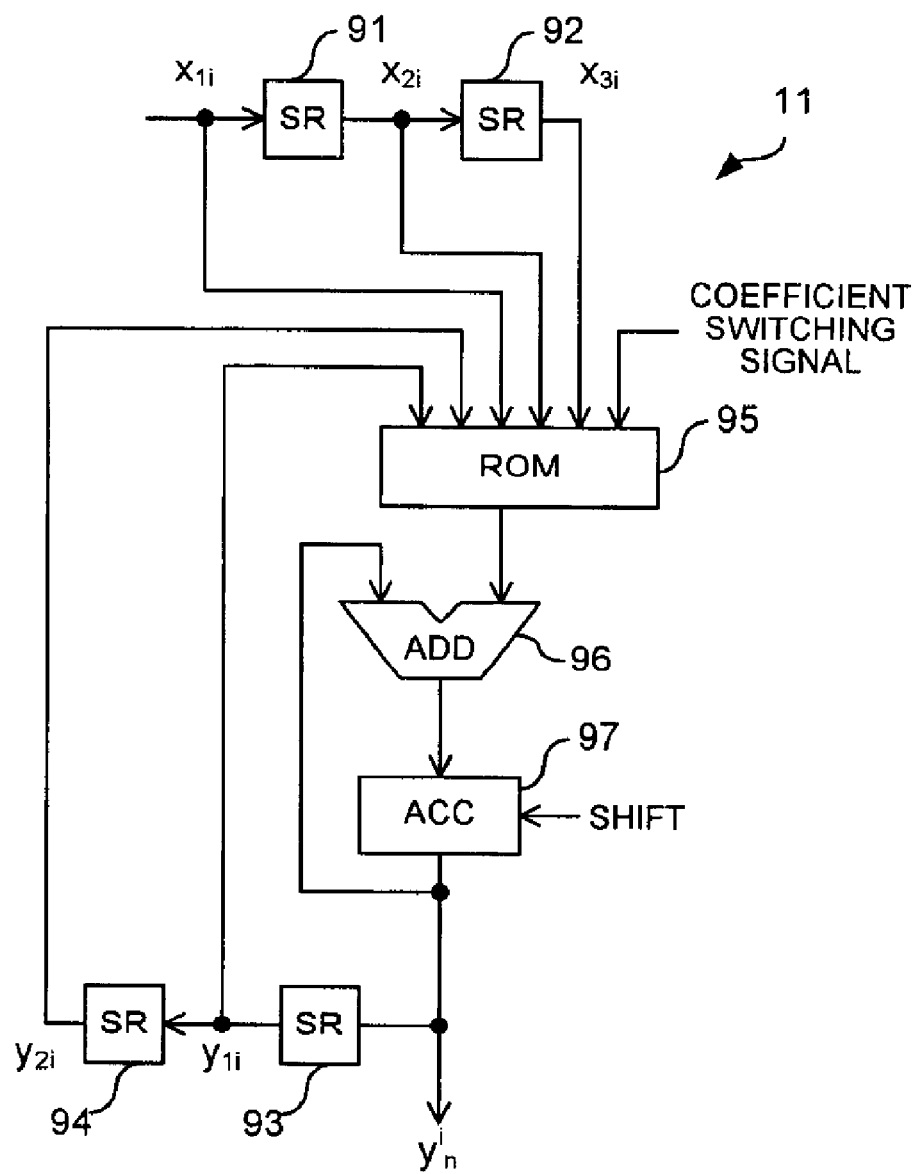
FIG. 11 shows an example of a configuration of the secondary IIR filter using a ROM.

In the case of the IIR filter, the high-pass filter can also be constituted by using a ROM. FIG. 11 shows an example of the secondary IIR filter using a ROM. As shown in FIG. 11, the high-pass filter 11 includes shift registers 91 to 94, a ROM 95, an adder-subtracter 96, and an accumulator 97. The attenuation processing unit of the present invention corresponds to the shift registers 91 to 94, the adder-subtracter 96, and the accumulator 97. The storing unit and the controlling unit of the present invention correspond to the ROM 95. The bit length of the shift registers 91 to 94 is L bits as is the case with the FIR filter and data are stored with the LSB in the lead.

When $x_n$ is input to the secondary IIR filter, by reversing the order of $x_n$ and $y_n$ to modify the equation as is the case with the FIR filter, $y_n$ can be expressed by the following equations (10) and (11).

$$y_n = \sum_{i=1}^{L-1} 2^{-i} S_{ni} - S_{n0} \tag{10}$$

$$S_{ni} = \sum_{n=1}^{3} x_{ni} h_n - \sum_{n=1}^{2} y_{ni} b_n \tag{11}$$

Therefore, $S_{ni}$ (frequency characteristic data) corresponding to a five-bit pattern of ($x_{1i}$, $x_{2i}$, $x_{3i}$, $y_{1i}$, $y_{2i}$) is stored in the ROM 95. The ROM 95 also stores $S_{ni}$ for the case of using coefficients other than $h_0$, $h_1$, $h_2$, $b_1$, and $b_2$ (e.g., $h'_0$, $h'_1$, $h'_2$, $b'_1$, and $b'_2$). When $S_{ni}$ is stored in the ROM 95, for example, the address is the five-bit pattern added with the detection signal output from the signal level detecting unit 17.

In this way, $S_{n(L-1)}$, $S_{n(L-2)}$, ..., $S_{n1}$, and $S_{n0}$ are sequentially read from the ROM 95 correspondingly to the five-bit pattern and the detection signal and are input to the adder-subtracter 96. The accumulator 97 shifts the value output from the adder-subtracter 96 to the right by one bit to multiply the value by $2^{-1}$ and inputs the result to the adder-subtracter 96 for accumulation. By repeating this accumulating process for L times, $y_n$ shown in equation (10) can be obtained. In the Lth accumulating process, $S_{n0}$ is subtracted in the adder-subtracter 96, and the accumulator 97 outputs the result without shifting.

In this way, in the case of the IIR filter using the ROM, the on/off control and the change in the cutoff frequency of the high-pass filter 11 can be performed by changing the value read from the ROM 95 based on the detection signal.

==Addition of Delay Circuit==

Figure 12:
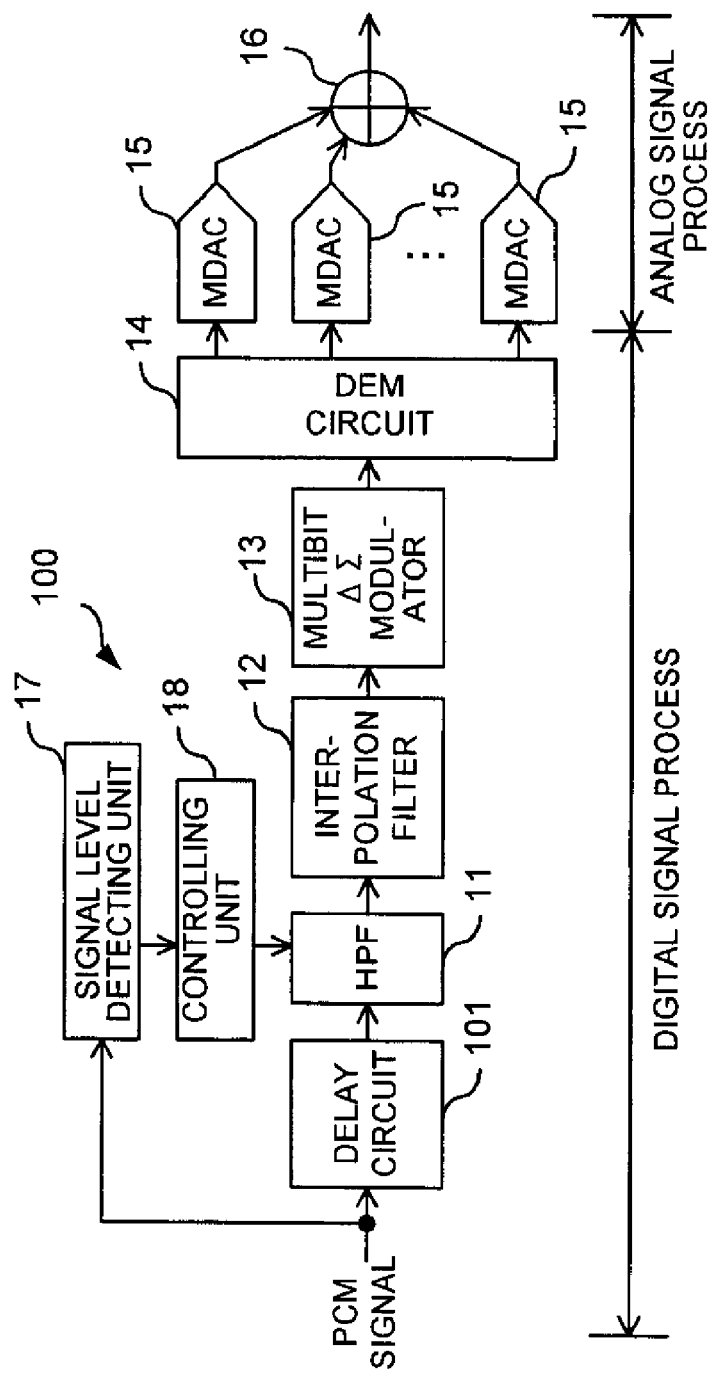
FIG. 12 shows an example of a configuration of the DA converter with a delay circuit added.
Figure 13:
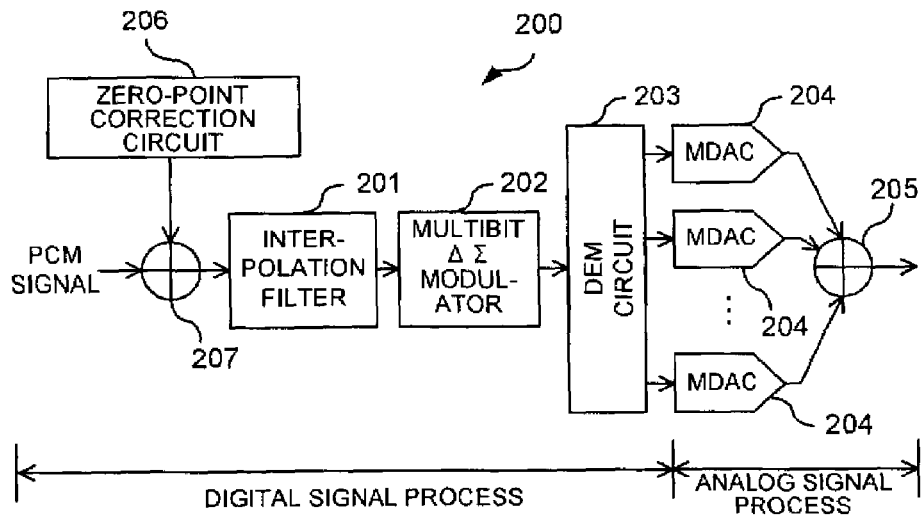
FIG. 13 shows a conventional example of a configuration of a DA converter using a zero-point correction circuit.
Figure 14:
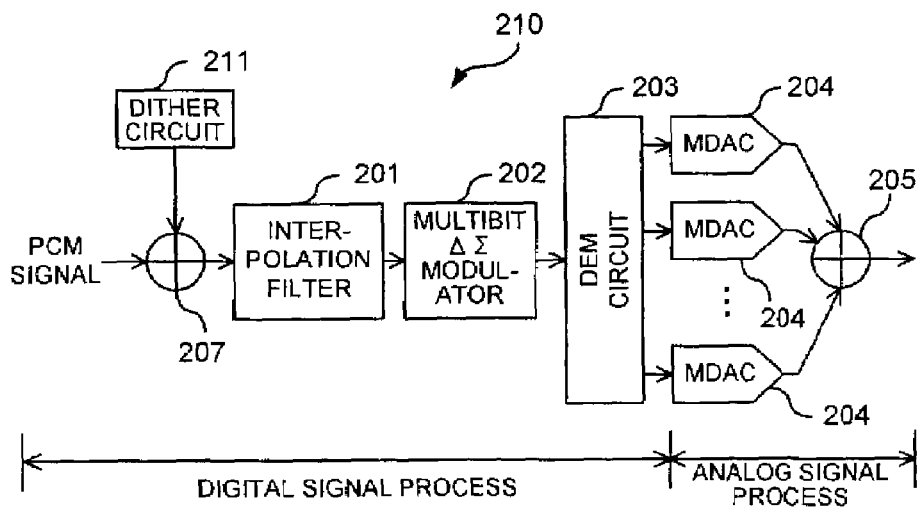
FIG. 14 shows a conventional example of a configuration of a DA converter using a dither circuit.
Figure 15:
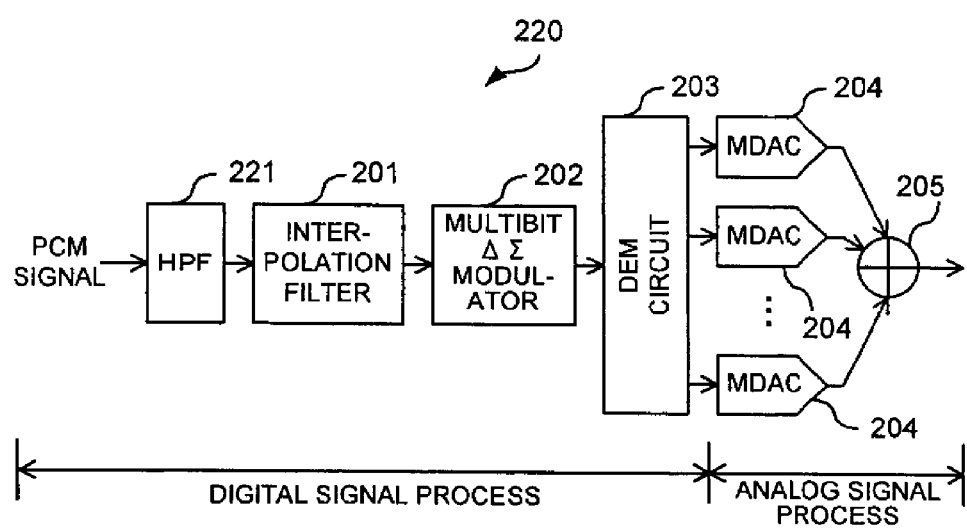
FIG. 15 shows a conventional example of a configuration of a DA converter using a high-pass filter.

Description will be made of an example of adding a delay circuit to the DA converter 1 shown in FIG. 1. FIG. 12 shows an example of a configuration of the DA converter 100 with a delay circuit 101 added. The delay circuit 101 is provided on a stage before the high-pass filter 11 and delays the input PCM signal for a certain period to output to the high-pass filter 11. The configuration is the same as the DA converter 1 of FIG. 1 except that the delay circuit 101 is added. The PCM signal before the input to the delay circuit 101 is input to the signal level detecting unit 17.

In this way, the signal level detecting unit 17 can output the result of comparison between the signal level and the threshold before the PCM signal is input to the high-pass filter 11. Therefore, the controlling unit 18 can turn on the high-pass filter 11 before the signal level of the PCM signal input to the high-pass filter 11 becomes less than the threshold and can turn off the high-pass filter 11 before the signal level becomes the threshold or higher. That is, the on/off control does not performed at signal levels that have an impact on the sound quality, such as when the signal level has become less than the threshold or when the signal level has become the threshold or higher, and the deterioration of the sound quality can be constrained.

The DA converter of the present invention mainly converts a digital audio signal to an analog signal and is often used along with a processing circuit for a digital video signal, etc. For example, in the case of those requiring time for video processing, such as plasma displays, a DA converter for the digital audio signal may be provided with a delay circuit to synchronize video displayed on a screen with audio output from a speaker. That is, the delay circuit 101 shown in FIG. 12 can be used also as the delay circuit for the purpose of synchronizing video and audio in this way. Therefore, in the case of the configuration shown in FIG. 12, the delay circuit does not have to be additionally provided and costs are not increased.

Description has been made of the DA converters 1, 100 of the embodiments of the present invention. As described above, in the DA converter 1, the high-pass filter 11 is turned on/off depending on the signal level of the input multibit digital signal. For example, when the signal level is increased to some extent, such as at the time of normal music reproduction, the high-pass filter 11 is turned off. In such a case, the idle tone is difficult to be heard and if the idle tone is generated by turning off the high-pass filter 11, no problem occurs practically. Since the signal is not attenuated by the high-pass filter 11, the sound quality is not deteriorated. For example, in the situation that the signal level is low enough to hear the idle tone, the high-pass filter 11 is turned on. In such a case, it is difficult to hear minute changes in music, etc. and if the high-pass filter 11 is turned on to constrain the generation of the idle tone, the effect of the sound quality deterioration does not practically exist. In this way, by turning on/off the high-pass filter 11 depending on the signal level, the circuit scale can be reduced and the effect of the idle tone can be easily prevented without deteriorating the sound quality.

The on/off control of the high-pass filter 11 can be realized by changing the frequency characteristic data such as coefficients of the digital filter such as the FIR filter and the IIR filter.

The frequency characteristic data can be changed by storing in the memory, etc. the frequency characteristic data for turning on the high-pass filter 11 and the frequency characteristic data for turning off the high-pass filter 11 and by switching which frequency characteristic data are used.

When the frequency characteristic data are changed, the frequency characteristic data can be changed stepwise to prevent the effect due to the abrupt change in the cutoff frequency.

The on/off of the high-pass filter 11 can be controlled with the use of a switch circuit, etc., instead of changing the frequency characteristic data.

If the signal level is compared with the threshold in an analog mode, a voltage corresponding to the threshold can be generated by resistor division. In this case, by attaching the resistor externally, the threshold can be changed with the connected resistor.

By using the delay circuit 101, the on/off control is avoided at the signal level affecting the sound quality to constrain the deterioration of the sound quality.

In the DA converter 1, the cutoff frequency of the high-pass filter 11 can also be changed depending on the signal level of the input multibit digital signal. That is, in the situation that the signal level is less than the threshold and the sensitivity to low pitch sound is reduced, the cutoff frequency can be increased. In this way, the changing point can be provided in the low pitch sound range of the audible band to enhance low pitch sound. If the signal level is at the threshold or greater, deterioration to the sound quality can be prevented by reducing the cutoff frequency.

When the cutoff frequency is changed, the frequency characteristic data can be changed stepwise to prevent the effect due to the abrupt change in the cutoff frequency.

When the cutoff frequency is changed and controlled, if the signal level is at a predetermined level or higher, the high-pass filter 11 can be controlled to be turned off. In this way, when the sound volume is increased to the extent that the effect of the idle tone does not exist, the deterioration of the sound quality can be constrained by turning off the high-pass filter 11.

While the embodiments of the present invention have been described hereinabove, the embodiments are for the purpose of facilitating the understanding of the present invention rather than limiting the interpretation of the present invention. The present invention may be changed or altered without departing from the sprit thereof and the present invention encompasses equivalents thereof.

What is claimed is:

1. A multibit ΔΣ modulation DA converter comprising:
    a filter unit that outputs a multibit digital signal with a predetermined frequency or lower thereof attenuated if a signal level of the input multibit digital signal is less than a predetermined threshold, the filter unit outputting the multibit digital signal without attenuation if the signal level is at the threshold or higher;
    a ΔΣ modulator that performs ΔΣ modulation of the signal output from the filter unit;
    a dynamic element matching circuit that divides the signal output from the ΔΣ modulator to a plurality of signals; and
    a plurality of internal DA converters that convert the plurality of signals output from the dynamic element matching circuit to an analog signal,
    wherein the filter unit includes:
        a high-pass filter that outputs the multibit digital signal with the frequency or lower thereof attenuated;
        a signal level detecting unit that outputs a result of comparison between the signal level and the threshold; and
        a controlling unit that controls whether or not the multibit digital signal is attenuated in the high-pass filter, based on the comparison result output from the signal level detecting unit.

2. The multibit ΔΣ modulation DA converter of claim 1, wherein the signal level detecting unit includes:
    a signal level detecting circuit to which the multibit digital signal is inputted that outputs the signal level; and
    a comparison circuit that outputs a result of comparison between the signal level output from the signal level detecting circuit and the threshold.

3. The multibit ΔΣ modulation DA converter of claim 2, wherein the signal level detecting unit includes a terminal that is connected with a resistor for generating the threshold from a predetermined voltage.

4. The multibit ΔΣ modulation DA converter of claim 1, wherein the high-pass filter includes:
    a storing unit that stores frequency characteristic data for determining the frequency; and
    an attenuation processing unit that attenuates the multibit digital signal based on the frequency characteristic data stored in the storing unit, and
    wherein the controlling unit changes the frequency characteristic data used by the attenuation processing unit based on the comparison result.

5. The multibit ΔΣ modulation DA converter of claim 4,
    wherein the storing unit stores first frequency characteristic data used when the multibit digital signal is attenuated and second frequency characteristic data used when the multibit digital signal is not attenuated, and
    wherein the controlling unit sets the frequency characteristic data used by the attenuation processing unit to either the first frequency characteristic data or the second frequency characteristic data based on the comparison result.

6. The multibit ΔΣ modulation DA converter of claim 4,
    wherein if a state of outputting the multibit digital signal without attenuation is changed to a state of outputting the multibit digital signal with a first frequency or lower thereof attenuated, the controlling unit changes the frequency characteristic data stepwise such that the frequency approaches to the first frequency stepwise.

7. The multibit ΔΣ modulation DA converter of claim 6,
    wherein the storing unit stores first frequency characteristic data used when the multibit digital signal is attenuated which is at or less than the frequency, second frequency characteristic data used when the multibit digital signal is not attenuated, and third frequency characteristic data when the multibit digital signal is attenuated which is at or less than a frequency lower than the frequency, and
    wherein if the frequency characteristic data used by the attenuation processing unit is changed from one of the first frequency characteristic data and the second frequency characteristic data to the other frequency characteristic data, the controlling unit changes the one frequency characteristic data to the third frequency characteristic data and then changes the third frequency characteristic data to the other frequency characteristic data.

8. The multibit ΔΣ modulation DA converter of claim 4, p1 wherein if a state of attenuating and outputting the multibit digital is changed to a state of outputting the multibit digital signal without attenuation, the controlling unit changes the frequency characteristic data stepwise such that the frequency approaches to zero stepwise.

9. The multibit ΔΣ modulation DA converter of claim 8,
    wherein the storing unit stores first frequency characteristic data used when the multibit digital signal is attenuated which is at or less than the frequency, second frequency characteristic data used when the multibit digital signal is not attenuated, and third frequency characteristic data when the multibit digital signal is attenuated which is at or less than a frequency lower than the frequency, and
    wherein if the frequency characteristic data used by the attenuation processing unit is changed from one of the first frequency characteristic data and the second frequency characteristic data to the other frequency characteristic data, the controlling unit changes the one frequency characteristic data to the third frequency characteristic data and then changes the third frequency characteristic data to the other frequency characteristic data.

10. The multibit ΔΣ modulation DA converter of claim 1, wherein the controlling unit includes a switch circuit that switches based on the comparison result whether the multibit digital signal is output through the high-pass filter or is output without the high-pass filter.

11. The multibit ΔΣ modulation DA converter of claim 1, further comprising a delay circuit that delays the multibit digital signal for a certain period before inputting to the high-pass filter.

12. A multibit ΔΣ modulation DA converter comprising:
a filter unit that attenuates a multibit digital signal at a first frequency or lower for output if a signal level of the input multibit digital signal is at a first threshold or higher, the filter unit attenuating the multibit digital signal at or less than a second frequency higher than the first frequency for output if the signal level is less than the first threshold;
a ΔΣ modulator that performs ΔΣ modulation of the signal output from the filter unit;
a dynamic element matching circuit that divides the signal output from the ΔΣ modulator to a plurality of signals; and
a plurality of DA converters that converts the plurality of signals output from the dynamic element matching circuit to an analog signal,
wherein the filter unit includes:
  a high-pass filter that attenuates and outputs the multibit digital signal;
  a signal level detecting unit that outputs a result of comparison between the signal level and the first threshold; and
  a controlling unit that controls whether a reference frequency for the attenuation in the high-pass filter is the first frequency or the second frequency, based on the comparison result output from the signal level detecting unit.

13. The multibit ΔΣ modulation DA converter of claim 12,
wherein the high-pass filter includes:
a storing unit that stores frequency characteristic data for determining the frequency; and
an attenuation processing unit that attenuates the multibit digital signal based on the frequency characteristic data stored in the storing unit, and
wherein the controlling unit changes the frequency characteristic data used by the attenuation processing unit based on the comparison result.

14. The multibit ΔΣ modulation DA converter of claim 13,
wherein the storing unit stores first frequency characteristic data used when the frequency is the first frequency and second frequency characteristic data used when the frequency is the second frequency, and
wherein the controlling unit sets the frequency characteristic data used by the attenuation processing unit to either the first frequency characteristic data or the second frequency characteristic data based on the comparison result.

15. The multibit ΔΣ modulation DA converter of claim 13,
wherein if the frequency is changed from the first frequency to the second frequency, the controlling unit changes the frequency characteristic data stepwise such that the frequency approaches from the first frequency to the second frequency stepwise.

16. The multibit ΔΣ modulation DA converter of claim 12,
wherein the filter unit outputs the multibit digital signal without attenuation if the signal level is at or higher than a second threshold higher than the first threshold.

\* \* \* \* \*